United States Patent [19]

Tsukakoshi

[11] Patent Number: 4,517,549

[45] Date of Patent: May 14, 1985

[54] WEIGHTED CAPACITOR ANALOGUE-DIGITAL CONVERTERS

[75] Inventor: Shosaku Tsukakoshi, Tokyo, Japan

[73] Assignee: Oki Electric Industry Co., Ltd., Tokyo, Japan

[21] Appl. No.: 293,264

[22] Filed: Aug. 17, 1981

[30] Foreign Application Priority Data

Aug. 25, 1980 [JP] Japan .................... 55-115835
Sep. 22, 1980 [JP] Japan .................... 55-130605

[51] Int. Cl.³ ................ H03K 13/02; H03K 13/17
[52] U.S. Cl. .................... 340/347 AD; 340/347 C; 340/347 M
[58] Field of Search ........... 340/347 AD, 347 DR, 340/347 C, 347 M, 347 CC

[56] References Cited

U.S. PATENT DOCUMENTS 4,200,863  4/1980  Hodges et al. ............ 340/347 AD
4,380,756  4/1983  Worsman .................. 340/347 C X
4,388,612  6/1983  Takagi et al. ............ 340/347 DA

OTHER PUBLICATIONS

Caves et al., A PCM Voice Codec with On-Chip Filters, IEEE Journal of Solid-State Circuits, vol. SC-14, No. 1, 2/1979, pp. 65-73.
"ALL-MOS Charge Redistribution Analog-to-Digital Conversion Techniques—Part I and II", EEE Journal of Solid-State Circuits, vol. SC-10, No. 6, Dec. 1975.

Primary Examiner—T. J. Sloyan
Attorney, Agent, or Firm—Wenderoth, Lind & Ponack

[57] ABSTRACT

In an analogue-digital converter of the type having a comparator, an array of capacitors having different capacities, one terminal of the capacitors being connected to one input terminal of the comparator, a plurality of switches for connecting the capacitors, except a first one of them, to an analogue signal input terminal or a source of reference voltage, there are provided a resistance voltage divider having a mid tap and connected between the source of reference voltage and ground, and a transfer switch for connecting the first capacitor to the analogue signal input terminal or to the mid tap of the resistance voltage divider, the mid tap thereof being connected to the other input terminal of the comparator.

8 Claims, 4 Drawing Figures

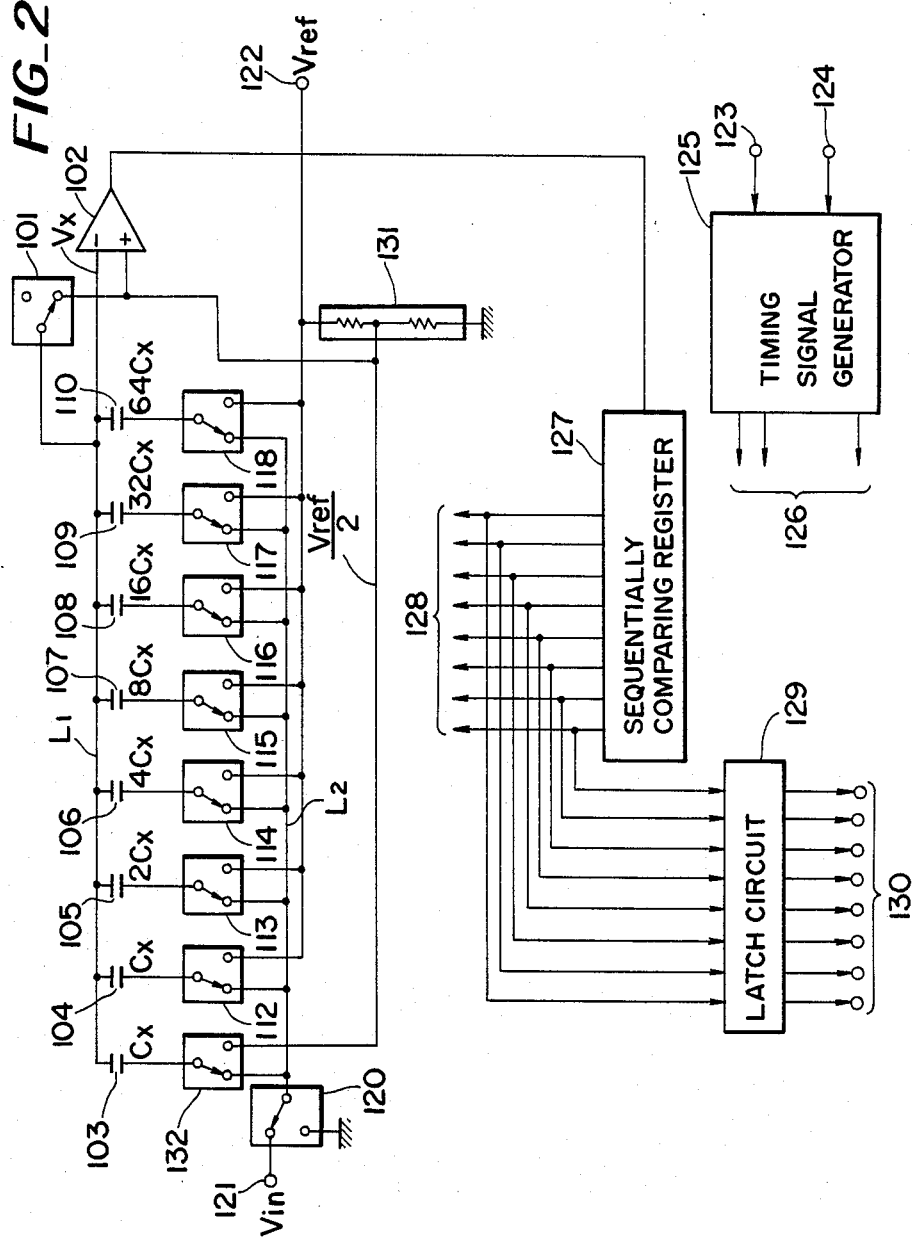

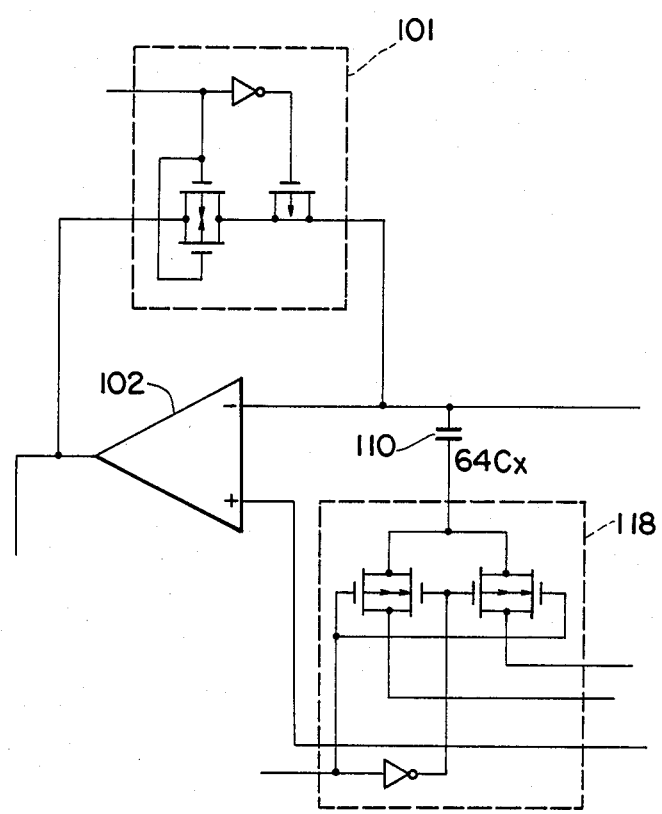
FIG_3

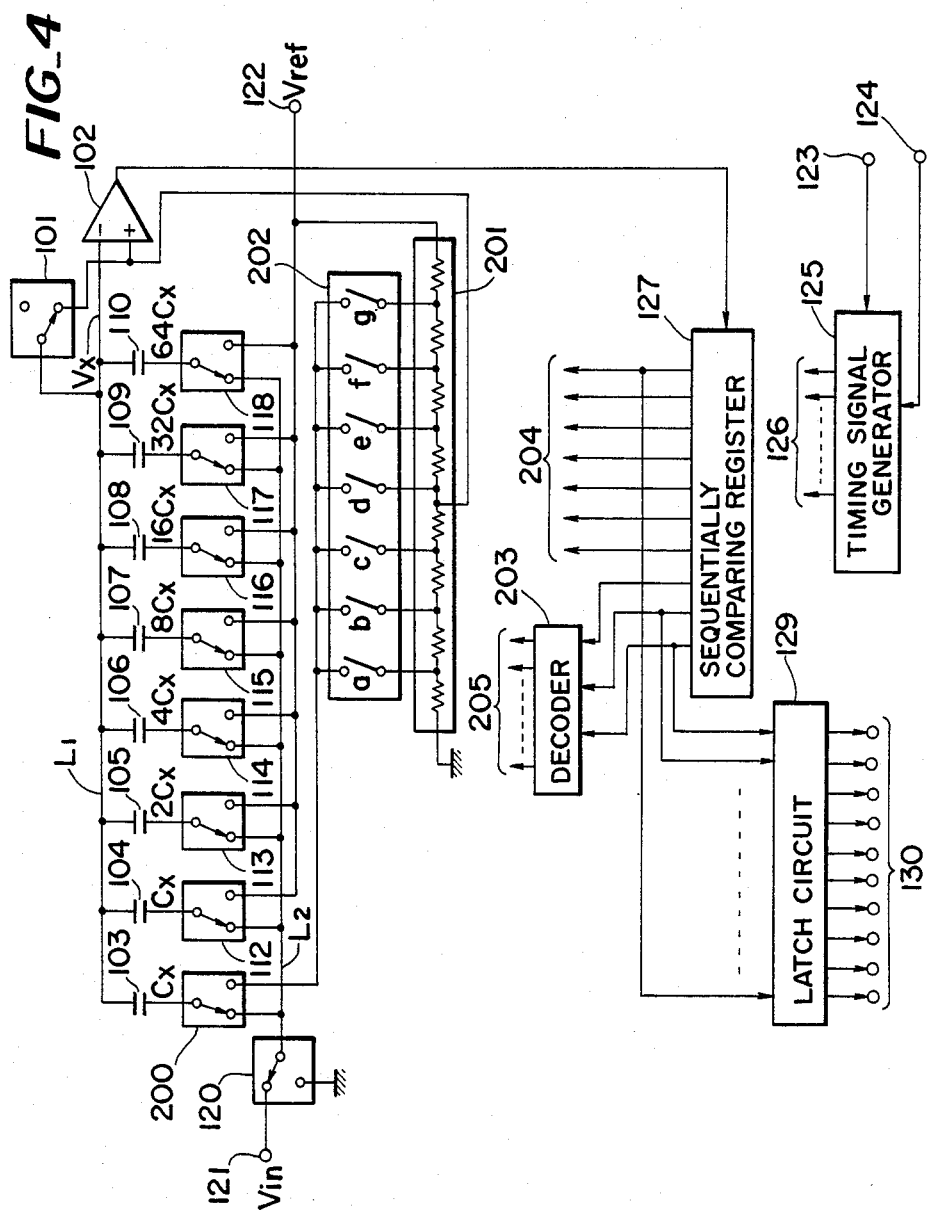

WEIGHTED CAPACITOR ANALOGUE-DIGITAL CONVERTERS

BACKGROUND OF THE INVENTION

This invention relates to a weighted capacitor analogue-digital converter and, more particularly, to a weighted capacitor analogue-digital converter having a resistance voltage divider.

One type of analogue-digital converter was developed in California University in United States and one example of an 8 bit weighted capacitor analogue-digital inverter is illustrated in FIG. 1 of the accompanying drawing.

In FIG. 1 each one of the capacitors 103 and 104 has a unit capacity, while capacitors 105 through 111 respectively have weighted capacities of twice, 4 times, 8 times, 16 times, 32 times, 64 times, and 128 times the unity capacity. These capacitors constitute a capacitor array and are formed on a semiconductor substrate through parallelly connected unit MOS capacitances.

Each of the switches 112 through 119 has one movable contact and two stationary contacts. Respective movable contacts of the switches are respectively connected to a line $L_1$ via capacitors 104 through 111 the left-hand stationary contacts are connected to a line $L_2$ and the right-hand stationary contacts are connected to a reference voltage input terminal 122.

A switch 101 is provided with a movable contact connected to line $L_1$, an idle stationary contact and a grounded stationary contact. Another switch 120 is provided with a movable contact connected to line $L_2$, a stationary contact connected to an analogue signal input terminal 121 and a grounded second stationary contact. A capacitor 103 is connected between lines $L_1$ and $L_2$. Since the non-inverting input of a comparator 102 is connected to ground, it is normally necessary to use two power supplies (i.e.—one positive supply and one negative supply) to power the comparator 102.

An inverting input terminal of the comparator 102 in the form of a differential amplifier is connected to line $L_1$, while a noninverting input terminal is grounded and its output terminal is connected to a control signal input terminal of a sequentially comparing register 127 which outputs a switch control code signal 128 consisting of 8 bits, for example, for controlling the switches 112 through 119. The switch control code signals 128 are also applied to a latch circuit 129 to be temporarily stored therein.

A timing signal generator 125 has a clock signal input terminal 123 supplied with a clock signal of a constant period and a synchronizing signal input terminal 124 supplied with a synchronizing signal which sets the analogue-digital converter to an initial state, and produces timing signals 126 which control the switches 101 and 120 and which controls the sequentially comparing register 127 according to a predetermined sequence.

The digital-analogue converter shown in FIG. 1 operates as follows. Upon application of a synchronizing signal to the synchronizing signal input terminal 124, the timing signal 126 sets the analogue-digital converter to its initial state for connecting the movable contact of the switch 120 to the analogue signal input terminal 121 and for grounding the movable contact of the switch 101. At the same time, the eight bit switch control code signal 128 becomes "00000000" so as to transfer the movable contacts of respective switches 112 through 119 to the line $L_2$. As a consequence, capacitors 103 through 111 are parallelly connected between the analogue signal input terminal 121 and the ground so that these capacitors are charged by the input signal voltage $V_{in}$ applied to the analogue signal input terminal 121.

When the movable contact of the switch 120 is transferred to the lower stationary contact to ground the line $L_2$ in response to the timing signal of the first operating cycle and when the movable contact of the switch 101 is transferred to the idle stationary contact to disconnect the line $L_1$ from the ground, the voltage $V_x$ applied to the inverting contact of the comparator 102 would become $-V_{in}$.

From this state, the comparator 102 starts its sequential comparison operation. To obtain the most significant bit of the digital output signal, the most significant bit of the switch control code signal 128 is made to be "1" by the timing signal of the second operating cycle, while the movable contact of the switch 119 is transferred to the right-hand stationary contact connected to the reference voltage input terminal 122.

Consequently, a capacitor voltage division circuit including two serially connected capacitors each having a capacitance of $128C_x$ is formed between the reference voltage input terminal 122 and the ground to raise the voltage of the line $L_1$ by $V_{Ref}/2$ so that the voltage $V_x$ applied to the noninverting input terminal of the comparator 102 would be changed to $(-V_{in}+V_{Ref}/2)$.

Then, the comparator 102 compares the ground potential with the voltage $V_x$ applied to the inverting input terminal so that when the output of the comparator 102 is "1", the most significant bit of the switch control code signal 128 becomes "1" with the result that the movable contact of the switch 119 is continuously connected to the reference voltage input terminal 122. On the other hand, when the output of the comparator 102 is "0", the most significant bit of the switch control code signal 128 becomes "0" with the result that the movable contact of the swtich 119 will be connected to line $L_2$ and maintained at the ground potential.

The timing signal 126 of the third operating cycle brings to "1" a bit next to the most significant bit of the switch control code signal 128 to transfer the movable contact of the switch 118 to the side of the reference voltage input terminal 122 whereby a new capacitance voltage dividing circuit is formed between the same and the ground so that a fraction of the reference voltage is superposed upon the voltage of the line $L_1$ obtained in the previous cycle.

These superposed voltages are applied to the noninverting input terminal of the comparator 102, and if the output thereof were "1", the bit next to the most significant bit (MSB) of the switch control code signal 128 would become "1" so that the movable contact of the switch 118 is still connected to the reference voltage input terminal 122, whereas when the output of the comparator 102 is "0", the bit next to the most significant bit of the switch control code signal 128 becomes "0" so that the movable contact of the switch 118 is connected to line $L_2$ to be maintained at the ground potential.

In the same manner, the logic values to the least significant bit (LSB) of the switch control code signal 128 are determined by the timing signals 126 of a series of the operating cycles. After all bit values of the switch control code signal 128 obtained by the sequence control have been temporarily stored in the latch circuit 129, these bit values are outputted as digital output signals 130 corresponding to the analogue input signal voltage $V_{in}$.

The analogue-digital converter shown in FIG. 1, however, requires 256 unit capacitors of the capacitor array in the case of an 8 bit analogue-digital converter, for example, so that when the converter is fabricated as a monolithic integrated circuit the area occupied by the capacitor array on a semiconductor substrate becomes extremely large, thus increasing the chip size of the integrated circuit. This makes it difficult to construct a microcomputer as a single chip. In addition, the two power supply requirement for the comparators further complicates the construction of the system on a single chip.

SUMMARY OF THE INVENTION

Accordingly, it is an object of this invention to provide an improved weighted capacitor analogue-digital conveerter capable of decreasing the total number of the unit capacitors and capable of operating with a single power supply and having resistance voltage divider.

Another object of this invention is to provide a high resolution MOS integrated weighted capacitor analogue-digital converter.

According to this invention, there is provided an analogue-digital converter of the type comprising a comparator, an array of a plurality of capacitors with their one terminals connected to one input terminal of the comparator, a plurality of switches with their movable contacts respectively connected to the other terminals of the capacitors except a first one of the array, one stationary contacts of the switches being commonly connected to an analogue signal inoput terminal, while the other stationary contacts of the switches being connected to a source of reference voltage, the capacitors in the array respectively having capacitances of 1, 2, 4, ... $2^{n-1}$ times of a unit capacitance in their order in the array, where n is an integer, a sequentially comparing register applied with outputs of the comparator for producing a digital signal corresponding to the input analogue signal and switch control code signals adapted to control the switches, a timing signal generator for disconnecting one stationary contacts of the switches from the analogue signal input terminal, characterized in that there are provided a resistance voltage divider having a mid tap and connected between the source of reference voltage and ground, the mid tap being connected to the other input terminal of the comparator, and a transfer switch for transferring the connection of the other terminal of the first capacitor between a first stationary contact of the transfer switch connected to the analogue signal input terminal and a second stationary contact of the transfer switch.

According to one embodiment the second stationary contact of the transfer switch is connected to the mid tap of the resistive voltage divider.

According to a modified embodiment the resistance voltage divider is provided with a mid tap connected to the other input of the comparator and a plurality of intermediate taps which are connected to the second stationary contact of the transfer switch through a plurality of contacts. A decoder is provided which in response to the outputs of the sequentially comparing register for producing control signals for controlling the contacts.

In another embodiment, a multi tap resistance resistance voltage divider is connected between the source of the reference voltage and the ground, and the intermediate taps of the potentiometer are connected to the second stationary contact of the transfer switch respectively through contacts of a switch array controlled by the output of the decoder.

BRIEF DESCRIPTION OF THE DRAWINGS

In the accomapnying drawings:

FIG. 2 is a connection diagram showing one embodiment of an 8 bit analogue-digital converter according to this invention;

FIG. 3 is a connection diagram showing a modified switch utilized in the analogue-digital converter shown in FIG. 2;

FIG. 4 is a connection diagram showing a 10 bit analogue-digital converter of this invention.

DESCRIPTION OF THE PREFERRED EMBODIMENTS

Figure 1:
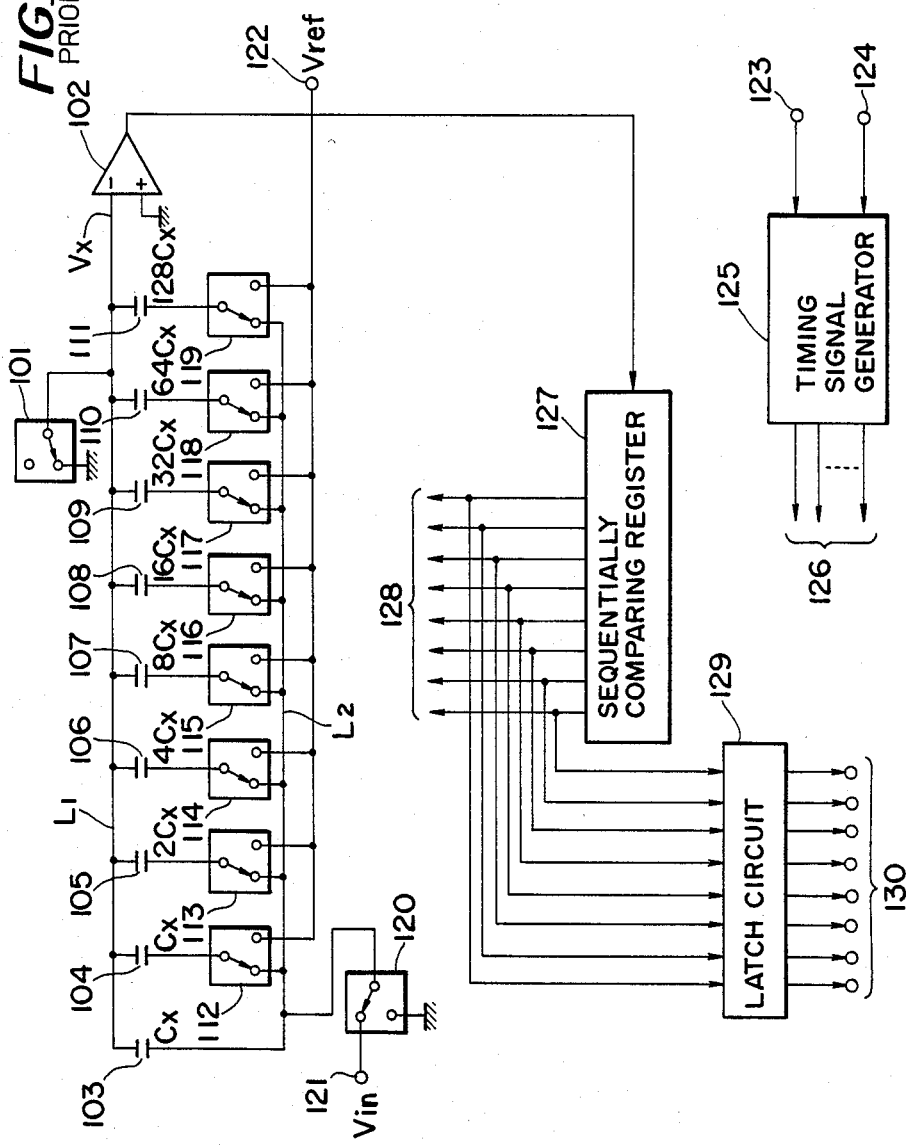
FIG. 1 is a connection diagram showing a prior art analogue-digital converter.

FIG. 2 shows an improved 8 bit weighted capacitor analogue-digital converter embodying the invention in which the circuit elements identical to those shown in FIG. 1 are designated by the same reference characters for avoiding duplicate description.

Thus, in FIG. 2, weighted capacitors 103 through 110, switches 112–118 and 120, timing signal generator 125, sequentially comparing register 127 and latch circuit 129 are identical to those shown in FIG. 1. Capacitors 104–110 constitute a capacitance array and switches 112–118 constitute a selection switch array. The capacitor 111 and switch 119 shown in FIG. 1 are eliminated, whereas a resistance voltage divider 131 having a mid tap and a switch 132 are newly added. Since neither input of the comparator 102 is grounded, the comparator 102 may be operated by a single positive power supply.

The switch 101 has a movable contact connected to a common line $L_1$ in the same manner as in FIG. 1, but its lower stationary contact is connected to a mid tap of the resistance voltage divider 131. The inverting input terminal of the comparator 102 is connected to line $L_1$, while its non-inverting input terminal is connected to the mid tap of the resistance voltage divider for receiving the reference voltage of $V_{Ref}/2$, and the output of the comparator 102 is applied to the control signal input terminal of the sequentially comparaing register 127. The capacitor 103 is connected between the line $L_1$ and the movable contact of switch 132, the left-hand stationary contact thereof being connected to line $L_2$ and its right-hand stationary contact being connected to the mid tap of the resistance voltage divider 131.

The analogue-digital converter shown in FIG. 2 operates as follows:

In the same manner as in FIG. 1, when a synchronizing signal is applied to the synchronizing signal input terminal 124 of the timing signal generator 125, the timing signals 126 generated thereby set the analogue-digital converter to its initial state so as to connect the movable contact of the switch 120 to the analogue signal input terminal 121 and to connect the movable contact of the switch 101 to the mid tap of the resistance voltage divider 131. At the same time, the 8 bit switch control code signal 128 becomes "00000000" to transfer the movable contacts of the switches 132 and 112–118 to the line $L_2$ side. Consequently, the capacitors 103–110 are connected in parallel between the analogue input terminal 121 and the mid tap of the resistance voltage divider 131 so as to be charged with a voltage of $(V_{in}-V_{Ref}/2)$.

Then, the switches 101 and 120 are switched by the timing signal 126 in the first operating cycle to remove the reference voltage $V_{Ref}/2$ from the line $L_1$ and to ground the line $L_2$. Then, the voltage applied to the inverting input terminal of the comparator 102 becomes $-(V_{in}-V_{Ref}/2)$.

The sequential comparison operation starts from this state. At first, for the purpose of determining the most significant bit (MSB) of the digital output signal, the MSB of the switch control code signal 128 is made to be "1" by the timing signal 126 in the second operating cycle so as to transfer the movable contact of the switch 118 to the side of the reference voltage input terminal 122.

Consequently, a voltage division circuit comprising two serially connected capacitors each having a capacitance of $64C_x$ is formed between the reference voltage input terminal 122 and the ground to increase the voltage of line $L_1$ by $V_{Ref}/2$, so that the voltage applied to the inverting input terminal of the comparator 102 is expressed by an equation:

$$V_x = -(V_{in}-V_{Ref}/2) + V_{Ref}/2.$$

When this input voltage $V_x$ causes the output of the comparator 102 to be "1", the MSB of the switch control signal 128 would become "1" so that the movable contact of the switch 118 is still connected to the reference voltage input terminal 122, whereas when the output of the comparator 102 is "0", the MSB of the switch control code signal 128 would become "0" and the movable contact of the switch 118 is connected to line $L_2$ to be maintained at the ground potential.

Then, a bit next to the MSB of the switch control code signal 128 is changed to "1" by the timing signal 126 in the third operating cycle so as to connect the movable contact of the switch 117 to the reference voltage input terminal 122. This forms a new capacitance voltage division circuit between the reference voltage input terminal 122 and the ground so that a fraction of the reference voltage would be superposed on the voltage on line $L_1$ obtained in the previous cycle.

For example, when the MSB of the switch control code signal 128 is "1" and when the output of the comparator 102 is also "1", the voltage applied to the inverting input terminal of the comparator 102 is expressed as follows:

$$V_x = -(V_{in}-V_{Ref}/2) + V_{Ref}/2 + V_{Ref}/4.$$

Accordingly, a bit next to the MSB of the switch control code signal 128 would become "1".

In the same manner, various capacitor voltage division circuits are formed by suitably combining switches 112 through 118 so as to form output logics of from the MSB to the seventh bit of the switch control code signal 128.

Then, the timing signal 126 causes the LSB of the switch control code signal 128 to become "1" so that the movable contact of the switch 132 is transferred to the mid tap of the resistance voltage divider 131 so as to form a new capacitor voltage division circuit. As a consequence, a voltage $V_{Ref}/2 \times (1/128)$ is superposed on the voltage of line $L_1$ to produce "1" or "0" on the output terminal of the comparator 102. When this output is "1" for example, the LSB of the switch control code signal 128 becomes "1" and the movable terminal of the switch 132 will be continuously connected to the mid tap of the resistance voltage divider 131.

When the logic values of the MSB through LSB of the switch control code signal 128 are determined in a manner as described above, all bits of the switch control code signal 128 formed by a series of sequence controls would be temporarily stored in the latch circuit 129 and then outputted therefrom as a digital output signal 130 corresponding to the analogue input signal voltage $V_{in}$. The voltage $V_x$ of the line $L_1$ can vary from $+V_{ref}/2$ to $-V_{ref}/2$ in response to an analogue input signal.

As above described, when determining the LSB of the digital output signal 130, one terminal of the capacitor 103 is connected to a source of a reference voltage of $V_{Ref}/2$ to vary the voltage of the line $L_1$ by $V_{Ref}/2 \times (1/128)$ to cause it to operate as an equivalent capacitor having one half of the capacitance value of the unit capacitance. For this reason, in an 8 bit analogue-digital converter, for example, it is poassible to decrease the total number of the unit capacitors of the capacitance array circuit from 256 to 128. Accordingly, when the analogue-digital converter is formed as a semiconductor integrated circuit, the area of the chip occupied by the capacitance array circuit is reduced to approximately ½ of the prior art converter. The analogue-digital converter in accordance with this invention can convert an analogue signal having an amplitude range of from 0 to $+V_{ref}$ into a digital signal, and therefore has a wide dynamic range in spite of being operated only by a single positive power source. Therefore, this feature thus provides a high resolution capability to an analogue-digital converter without increasing the number of unit capacitors.

Although in the first embodiment shown in FIG. 2, the switch 101 is connected between the noninverting input terminal and the inverting input terminal of the comparator, the same object can be attained when the switch 101 is connected between the noninverting input and the output of the comparator 102 as shown in FIG. 3. In this case, at the time of sampling the analogue input signal, as the offset voltage of the comparator 102 is applied to the capacitor array, the offset correction of the comparator 102 can be made automatically.

FIG. 3 shows a modification in which the switches 101 and 118 are respectively constituted by MOS transistors. Since the sequentially comparing type weighted capacitor analogue-digital converter embodying the present invention does not require any negative power supply, it can be simply formed into a single chip together with other digital circuits and can be advantageously used as input circuits for microcomputers and data processing LSIs.

FIG. 4 shows a modification of this invention in which elements corresponding to those shown in FIG. 2 are designated by the same reference characters. It is noted that as in FIG. 2, the comparator 102 in FIG. 4 may also be operated by a single positive supply. The embodiment shown in FIG. 4 is different from that shown in FIG. 2 in that the resistance voltage divider 131 is replaced by a multi tap resistance voltage divider 201, and that a switch array 202, a decoder 203 and a switch 200 which are controlled by the timing signals 126 are added. The resistance voltage divider 201 has a mid tap connected to the lower stationary contact of the switch 101 and 7 intermediate taps respectively connected to the right-hand stationary contact of a switch 200 via movable contacts a through g of the switch array 202. In this case, capacitor 103 is connected between line $L_1$ and the movable contact of the switch 200, while the left-hand stationary contact of the switch 200 is connected to the movable contact of the switch 120 connected to line $L_2$.

In this case, the sequentially comparing register 127 produces a ten bit code signal. A switch control code signal 204 comprising the upper order 7 bits controls switches 112 through 118, while a code signal comprising the lower order 3 bits is applied to a decoder 203 which produces a switch control code signal 205 that controls the switch array 202.

The modification shown in FIG. 4 operates as follows: In the same manner as in FIG. 2, upon application of a synchronizing signal to the synchronizing signal input terminal 124 of the timing signal generator 125, the timing signals 126 produced thereby set the analogue-digital converter in its initial state so as to connect the movable contact of the switch 120 to the analogue input terminal 121 and to connect the movable contact of switch 101 to the mid tap of the resistance voltage divider 201. At the same time, the 7 bit switch control code signal 204 becomes "0000000" so as to switch the movable contacts of the switches 112–118 to the side of line $L_2$ for sampling the analogue input signal $V_{in}$. Furthermore, the lower order three bits of the output code signal of the sequentially comparing register 127 also become "000" so that the switch control signals 205 outputted from the decoder 203 open all contacts a through g of the switch array 202. Consequently, capacitors 103 through 110 are connected in parallel across the analogue input terminal 121 and the mid tap of the resistance voltage divider 201 so that these capacitors are charged to a voltage of $(V_{in} - V_{Ref}/2)$.

Then, the switches 101 and 120 are switched by the timing signal 126 in the first operating cycle to disconnect the line $L_1$ from the mid tap of the potentiometer 201 and to ground the line $L_2$, whereby the voltage $V_x$ applied to the noninverting input of the comparator 102 becomes equal to $-(V_{in} - V_{Ref}/2)$.

From this state, the sequential comparison operation is started. Thus, to determine the MSB of the digital output signal, the MSB of the switch control code signal 204 is changed to "1" by the timing signal 126 of the second operating cycle so as to switch the movable contact of the switch 118 to the side of the reference voltage input terminal 122.

Consequently, a voltage division circuit including two serially connected capacitors each having a capacitance of $64C_x$ is formed between the reference potential input terminal 122 and the ground to raise the voltage of the line $L_1$ by $V_{Ref}/2$. Consequently, the voltage applied to the noninverting input of the comparator 102 is shown by $$V_x = -(V_{in} - V_{Ref}/2) + V_{Ref}/2.$$

When this voltage $V_x$ changes the output of the comparator 102 to "1", the MSB of the switch control code signal 204 becomes "1" so that the movable contact of the switch 118 is still connected to the reference voltage input terminal 122. Conversely, when the output of the comparator 102 is changed to "0", the MSB of the switch control code signal 204 would become to "0" so that the movable contact of the switch 118 is connected to the line $L_2$ to be maintained at the ground potential.

Then, a bit next to the MSB of the switch control code signal 204 is changed to "1" by the timing signal 126 of the third operating cycle to transfer the movable contact of the switch 117 to the side of the reference signal input terminal 122, with the result that a new capacitor voltage division circuit is formed between the reference voltage input terminal 122 and the ground, so that a fraction of the reference voltage would be superposed upon the voltage on the line $L_1$.

For example, where the MSB of the switch control code signal 204 is "1" and the output of the comparator 102 is also "1", the voltage applied to the noninverting input terminal of the comparator 102 is expressed by $$V_x = -(V_{in} - V_{Ref}/2) + V_{Ref}/2 + V_{Ref}/4$$

so that a bit next to the MSB of the switch control code signal 204 becomes "1".

Thereafter, in the same manner as above described, by the combinations of the capacitors 103 through 110 and switches 112 through 118, various capacitor voltage dividing circuits are formed to determine the output logic values of the MSB through the 7th bit of the switch control code signal 204.

Then, the movable contact of the switch 200 is transferred to the right-hand stationary contact by the timing signal 126 of the 8th operating cycle. At the same time, the 8th bit of the output code signal of the sequentially comparing register 127 is changed to "1" to close the contact d of the switch array 202, whereby the reference voltage $V_{Ref}/2$, the voltage $4/8V_{Ref}$ obtained at the right-hand stationary contact of the switch 200 and capacitors 103 through 110 form a new capacitor voltage dividing circuit.

When the voltage of line $L_1$ provided by this capacitor voltage dividing circuit makes "0" the output signal of the comparator 102, the 8th bit of the output code signal would be changed to "0", whereas when the output of the comparator 102 is "1", the 8th bit of the output code signal would be set to "1" thus opening the switch d.

When the 8th bit of the output code signal is "1", the timing signal 126 of the 9th operating cycle closes contact f to apply a voltage $6/8V_{Ref}$ to the right-hand contact of the switch 200. The logic value of the 9th bit is determined in accordance with the output logic value of the comparator 102.

Where the 9th bit of the output code signal is "1", the timing signal 126 of the 10th operating cycle selects contact g, whereas when the 9th bit is "0" contact e would be selected to apply to the right-hand terminal of the switch a voltage $\frac{7}{8}V_{Ref}$ or $\frac{5}{8}V_{Ref}$, and the logic value of the LSB (the 10th bit) of the output code signal is determined in accordance with the output logic value at that time of the comparator 102.

On the other hand, when the 8th bit of the output code signal is "0", the timing signal 126 of the 9th operating cycle selects contact b to determine the logic value of the 9th bit. Thereafter, with similar sequence controls, contacts a or c are selected to determine the logic values of the 9th and 10th bits of the output code signal.

After the logic values of all bits of output of the sequentially comparing register 127 have been determined as above described by a series of sequence controls, these logic values are temporarily stored in a latch circuit 129 and then outputted therefrom as a digital output signal 130 corresponding to the analogue input signal voltage $V_{in}$. The voltage $V_x$ of the line $L_1$ varies from $+V_{ref}/2$ to $-V_{ref}/2$ in response to an analogue signal. The voltage added to the lower terminal of unit capacitor 103 can be adjusted more finely by using a resistance voltage divider 201 and a switch array 202 having different taps.

The analogue-digital converter of this invention can convert an analogue signal having an amplitude of from 0 to $+V_{ref}$ into a digital signal, and therefore has a wide dynamic range in spite of being operated only by one positive power supply.

As above described, according to this embodiment, by merely adding a switch array 20 to the resistance voltage divider 201, and adding a decoder 203 to control the switch array 202, it becomes possible to construct a 10 bit analogue-digital converter with 128 unit capacitors. In contrast with the prior art construction shown in FIG. 1, in order to obtain a 10 bit analogue-digital converter it is necessary to add weighted capacitors having capacitance values of $256C_x$ and $512C_x$ to the capacitor array thereby resulting in a total of 1024 unit capacitors. This means that this embodiment permits a large reduction in the chip area when the analogue-digital converter is formed as a MOS IC. The analogue-digital converter according to this invention does not need any negative power source because during a sequentially comparing operation, the non-inverting terminal of the comparator 102 is at $V_{ref}/2$ and the other terminals of the weighted capacitors can be grounded by the switch 120. This feature can provide a higher resolution capability which is obtained without increasing the number of unit capacitors, and provides a very wide dynamic range for the analogue signal in spite of using only one positive power source, and allows a comparing operation of a direct voltage signal.

Although in the embodiment shown in FIG. 4 a voltage equal to one half of the reference voltage was applied to the noninverting input of the comparator, the same object can also be accomplished by gounding the noninverting input as shown in FIG. 3.

While in the embodiment shown in FIG. 4, the switch 101 was connected between the inverting and noninverting input terminals of the comparator 102, the switch 101 can also be connected between the inverting input terminal and the output terminal of the comparator 102 as shown in FIG. 3. Since at the time of sampling the analogue signal, the offset voltage of the comparator 102 is applied to the capacitance array circuit, this construction enables automatic correction of the offset of the comparator 102.

What is claimed is:

1. In an analogue-digital converter of the type comprising a comparator having inverting and non-inverting input terminals, an array of a plurality of capacitors with their one terminals connected to said inverting input terminal of said comparator, a plurality of switches with their movable contacts respectively connected to the other terminals of said capacitors, one stationary contacts of said switches being commonly connected to an analogue signal input terminal through an additonal switch which alternately connects said stationary contacts to a ground potential and the other stationary contacts of said switches being connected to a source of a reference voltage, said capacitors in said array respectively having capacitances of 1, 2, 4, . . . $2^{n-1}$ times a unit capacitance in their order in said array, where n is an integer, a first capacitor having a unit capacitance and having one terminal connected to said inverting input terminal of said comparator, a sequentially comparing register which is supplied with outputs of said comparator for producing a digital signal corresponding to said input analog signal and switch control code signals adapted to control said switches, a timing signal generator for disconnecting said one stationary contacts of said switches from said analogue signal input terminal, the improvement which comprises a resistance voltage divider having a mid tap and connected between said source of reference voltage and ground, said mid tap being connected to said non-inverting input terminal of said comparator, and further comprising a transfer switch having first and second stationary terminals and a moveable terminal, said moveable terminal of said transfer switch being connected to the other terminal of said first capacitor for transferring the connection of the other terminal of said first capacitor between said first stationary contact of said transfer switch which is connected to said analogue signal input terminal through said additional switch and said second stationary contact of said transfer switch.

2. The analogue-digital converter according to claim 1, which further comprise a switch array including a plurality of contacts connected between respective intermediate taps of said resistance voltage divider and said second stationary contact of said transfer switch, and a decoder supplied with the outputs of said sequentially comparing register for outputting switch control code signals adapted to control the contacts of said switch array.

3. The analogue-digital converter according to claims 1 or 2, which further comprises a latch circuit which temporarily latches the output of said sequentially comparing register and then outputs said output as a digital signal.

4. The analogue-digital converter according to claim 2, which further comprises a switch connected between said inverting and noninverting input terminals of said comparator.

5. In a weighted capacitor analogue-digital converter for linearly converting an analogue signal into a digital signal, said converter comprising: a weighted capacitor array which has an additional capacitor of a unit capacitance value and a plurality of capacitors respectively having capacitance value of 1, 2, 4, . . . $2^{n-1}$ times said unit capacitance value in their order, where n is an integer, one terminal of each of said capacitors of said capacitor array being connected to a first common line; a voltage comparator having an inverting input terminal, a non-inverting input terminal, and an output terminal and operated by a single power source, said inverting input terminal being connected to said common line; a sequentially comparing register coupled to said output terminal, said register producing said digital signal corresponding to said analogue signal; a timing signal generator for producing control signals; a first switch operated by said timing signal generator; a first plurality of switches operated by said sequentially comparing register, said plurality of switches respectively connecting the other terminal of each of said plurality of capacitors of said weighted capacitor array to either a second common line or to a reference voltage source; a second switch operated by said timing generator, said second switch selectively connecting the other terminal of said additional capacitor to either said second common line or to a third common line; and a third switch operated by said timing signal generator and connected to said first common line;

the improvement comprising: a resistance voltage divider connected between said reference voltage source and ground and having a plurality of taps for providing fractions of said reference voltage and a mid tap for providing one half of said reference voltage, said mid tap being connected to said non-inverting terminal of said comparator, and further comprising a second plurality of switches operated so as to couple one of said taps of said resistance voltage divider to said third common line in response to said digital signal of said register, said first switch selectively connecting said second common line to either said analogue signal or to ground.

6. A weighted capacitor analogue-digital converter according to claim 5, wherein said third switch selectively connects said first common line to said non-inverting input terminal of said comparator.

7. A weighted capacitor analogue-digital converter according to claim 6, further comprising a decoder for controlling said second plurality of switches in response to a lower order bit of said digital signal of said sequentially comparing register, and a latch circuit for temporarily storing said digital signal of said sequentially comparing register, said first plurality of switches being controlled by higher order bits of said digital signal of said sequentially comparing register.

8. A weighted capacitor analogue-digital converter according to claim 7, wherein said capacitor array comprises MOS capacitors, and said first, second and third switches respectively comprise MOS transistors, and said first and second plurality of switches respectively comprise MOS transistors.

* * * * *